(12) United States Patent
Järvinen et al.

(10) Patent No.: US 6,301,467 B1
(45) Date of Patent: Oct. 9, 2001

(54) BIAS VOLTAGE CONTROLLED PARALLEL ACTIVE COMPONENTS

(75) Inventors: Esko Järvinen, Espoo; Jukka Varis, Vantaa, both of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/082,735

(22) Filed: May 21, 1998

(30) Foreign Application Priority Data

Jun. 2, 1997 (FI) ........................................... 972330

(51) Int. Cl.[7] ........................................ H04B 1/46
(52) U.S. Cl. .................. 455/80; 455/73; 455/86; 455/522; 455/69; 330/51
(58) Field of Search .................. 455/73, 76, 78, 455/80, 82, 83, 86, 275, 277.1, 553, 188.1, 101, 103, 126, 127, 129, 68, 69, 70, 67.1, 330; 330/51, 295, 101; 375/60

(56) References Cited

U.S. PATENT DOCUMENTS

| 5,054,114 | * | 10/1991 | Erickson | 455/83 |
| 5,091,919 | * | 2/1992 | Kuisma | 375/60 |
| 5,123,031 | * | 6/1992 | Kuisma | 375/60 |
| 5,475,875 | * | 12/1995 | Katsuyama et al. | 455/275 |
| 5,541,554 | * | 7/1996 | Stengel et al. | 330/51 |
| 5,570,062 | * | 10/1996 | Dent | 330/51 |
| 5,678,199 | * | 10/1997 | Birth et al. | 455/80 |
| 5,752,172 | * | 5/1998 | Matero | 455/127 |
| 5,794,159 | * | 8/1998 | Portin | 455/553 |
| 5,852,603 | * | 12/1998 | Lehtinen et al. | 370/280 |
| 5,896,562 | * | 4/1999 | Heinonen | 455/78 |
| 5,983,061 | * | 11/1999 | Lehtinen | 455/78 |

FOREIGN PATENT DOCUMENTS 0 578 324 A1   1/1994   (EP) .

OTHER PUBLICATIONS

European Search Report.

* cited by examiner

*Primary Examiner*—Dwayne Bost
*Assistant Examiner*—Joy K. Contee
(74) *Attorney, Agent, or Firm*—Perman & Green, LLP

(57) ABSTRACT

The course of an oscillating signal is controlled in mutually alternative first active component (31) and second active component (32), both of which can be set into active state by a certain first value of a control signal brought to the component and which are in inactive state with a certain second value of the control signal. The signal is directed to pass through the first active component (31) by setting it into active state by a control signal (33) brought to it. At the same time, the second active component (32) is prevented from affecting the course of the signal by setting a control signal brought to it to a second value (107, 111).

14 Claims, 7 Drawing Sheets

BIAS VOLTAGE CONTROLLED PARALLEL ACTIVE COMPONENTS

FIELD OF THE INVENTION

The invention relates in general to the selection of mutually alternative circuits by means of an electric signal. In particular the invention relates to the selection cf parallel amplifiers such that all of them are not simultaneously in use.

BACKGROUND ART

In many signal processing applications, signals must be offered in various situations alternative routes through active components. An exemplary case is provided by a radio transmitter's power amplifier arranged so as to operate at different power levels according to need. It is known that the transmission power of a mobile phone, for example, varies in accordance with the magnitude of the power needed to establish a functional and error-free uplink connection between the mobile phone and a base station. The efficiency of individual radio-frequency amplifiers varies as a function of the output power so that the amplifier is usually the most efficient at high output power values. When such a radio-frequency amplifier operates at a lower power, the efficiency is poor and electric power is wasted.

To save the batteries of portable radio apparatuses the consumption of electricity in all parts of the apparatuses should be minimal in all situations, wherefore different solutions have been developed to improve the efficiency of the amplifiers at low power levels. A known solution is to place in the power amplifier of a transmitter, instead of a single radio-frequency amplifier, two or more parallel amplifiers optimised to different power levels. The outputs of the parallel amplifiers are connected to a selection switch to select the amplifier which is closest to optimum for the current power level. In the GSM (Global System for Mobile Telecommunications), for instance, the selection is carried out as follows: the base stations measure the strengths of the signals received from mobile terminals and send out commands lo the terminals, instructing the terminals to adjust the transmission power. When a received signal becomes weaker, the base station instructs the terminal to increase the transmission power or hand over the connection to another base station. If a received signal is so strong that the transmission power of the terminal can be decreased without compromising signal quality, the base station instructs the terminal to decrease the transmission power. In the GSM system, the transmission power of a hand phone may typically vary from 1 mW to 2 W (in the dBm scale, from 0 dBm to +33 dBm).

It can be considered a disadvantage of prior-art solutions that a selection switch connected in series with parallel amplifiers has to be capable of withstanding the maximum output power of the amplifier with the highest power so that the switch easily becomes rather large in size and expensive to manufacture. In addition, a selection switch connected in series on the path of the signal causes losses, which is in contradiction with the power-saving goals of the arrangement. Switch arrangements cause unnecessary losses also in other cases where the signal has to be directed to pass through at least two mutually alternative active components. An, example of such a switch arrangement is an antenna switch of a radio apparatus based on time division duplex, TDD, which couples to the antenna of the radic apparatus either the power amplifier output of the transmitter or the low-noise preamplifier input of the receiver.

SUMMARY OF THE INVENTION

An object of the present invention is to provide a method and circuit arrangement with which the course of a signal can be controlled in mutually alternative active components with smaller losses than in the arrangements according to the prior art. Another object of the invention is to provide a method and circuit arrangement with which the above-mentioned object is achieved with low manufacturing costs and using small-sized components.

The objects of the invention are achieved by selectively setting the active components into active or inactive state by means of voltage signals brought to themrr so that an active component in inactive state presents high impedance which has no significant effect on the propagation of the signal.

The circuit arrangement according to the invention to control the course of arm oscillating signal in mutually alternative first active component and second active component, both of which can be set into active state by a certain first value of a control signal brought to the component and which are set into inactive state by a certain second value of said control signal, is characterised in that it comprise, means for setting said active components selectively into active state so that the first active component can be set into active state by a control signal brought to it while the second active component is in inactive state, and the second active component can be set into active state by a control signal brought to it while the first active component is in inactive state.

The invention is also directed to a communications device employing the circuit arrangement mentioned above. The communications device according to the invention is characterised in that it comprises means for selectively setting alternative active components included in it into active state so that a first active component can be set into active state by a control signal brought to it while a second active component is in inactive state, and the second active component can be set into active state by a control signal brought to it while the first active component is in inactive state.

The invention is further directed to a method which is characterised in that a signal is directed to travel via a first active component by setting it into active state by means of a control signal brought to it and simultaneously essentially preventing a second active component from influencing the course of the signal.

It is typical of active components, such as transistors, that the impedance. represented by their electrodes in the circuit to which they are connected depends on the biasing of the active component. For example, the output impedance of a transistor amplifier in active state differs from the output impedance of a transistor amplifier in inactive state. In the case of parallel transistor amplifiers the invention means that their outputs are interconnected in the manner described later on so that the output impedance of the unbiased (inactive) transistors is utilised as part of the amplifier block output matching circuit. Parallel with the output of an active transistor, the inactive transistors look like high-impedance circuits which have very little effect on the operation of the active transistor or on the flow of the signal from the output of the active transistor toward an antenna or other destination. For practical considerations the inactive transistors may be treated as not affecting the signal at all.

The invention is not confined to the selection of parallel codirectional amplifiers. Of a transmitter amplifier output and receiver amplifier input connected to an antenna, for example, one can be made by means of biasing to seem to a signal as a high-impedance circuit so that the biasing replaces a separate antenna switch.

A selection switch that selectively couples different bias voltages can be rated for a considerably lower maximum power than a prior-art selection switch connected in series with the amplifiers, whereby the circuit arrangement according to the invention is smaller in size and has lower manufacturing costs than solutions according to the prior art. In addition, the invention eliminates unnecessary switch components connected in series on the path of the signal, thus reducing losses and further improving the efficiency of the circuit arrangement. In addition to literally setting the bias voltages, the same biasing effect may be achieved by affecting the operating voltages of the parallel active components in a way described in more detailed fashion later.

BRIEF DESCRIPTION OF THE DRAWINGS

The invention is described in more detail with reference to the preferred embodiments presented by way of example and to the accompanying drawing wherein.

DETAILED DESCRIPTION OF THE PREFERRED EMBODIMENTS

Figure 1A:
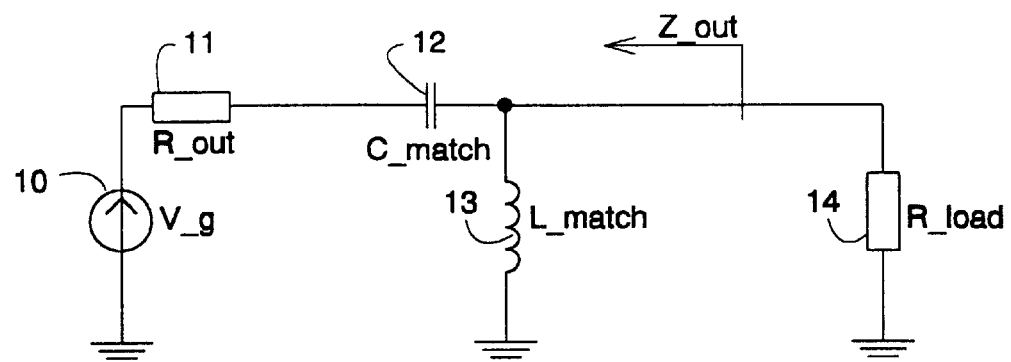
FIGS. 1a to 1c illustrate the determination of output impedance in a radiofrequency amplifier.

Like elements in the drawing are denoted by like reference designators.

In FIG. 1a, a current source 10 represents a transistor biased into active state, said transistor being e.g. a heterojunction bipolar transistor, HBT, and a resistive element 11 represents the mainly resistive output impedance of such a transistor biased into active state. A capacitance 12 and inductance 13 form an LC matching circuit by means of which the output impedance of the transistor is matched to the impedance of the load 14. It should be noted that there are also other ways to match the output impedance of an active circuit, known to the person skilled in the art as such; a simple example is a circuit otherwise resembling that of FIG. 1a but having an inductor or a transmission line in place of the capacitance 12 and a capacitance in place of the inductance 13 of FIG. 1a. Regarding the exemplary embodiment of FIG 1a, to calculate the values of the impedance matching components, the amplifier's output impedance can be expressed at Z_out as follows:

$$Z\_out(\omega) = \frac{R\_out \cdot L\_match^2 \cdot C\_match^2 \cdot \omega^4}{1 + (R\_out^2 \cdot C\_match^2 - 2 \cdot L\_match \cdot C\_match) \cdot \omega^2 + L\_match^2 \cdot C\_match^2 \cdot \omega^4} +$$

-continued
$$j \cdot \frac{L\_match \cdot \omega + L\_match \cdot C\_match \cdot (R\_out^2 \cdot C\_match - L\_match) \cdot \omega^3}{1 + (R\_out^2 \cdot C\_match^2 - 2 \cdot L\_match \cdot C\_match) \cdot \omega^2 + L\_match^2 \cdot C\_match^2 \cdot \omega^4}$$

Presuming that the real part of the output impedance Z_out equals the resistive load impedance R_load and the imaginary part is zero, we get a set of equations that have the solution:

$$L\_match = \frac{R\_out \cdot R\_load}{\omega \cdot \sqrt{R\_out \cdot (R\_load - R\_out)}} \quad (1)$$

$$C\_match = \frac{1}{\omega \cdot \sqrt{R\_out \cdot (R\_load - R\_out)}}$$

Figure 1B:
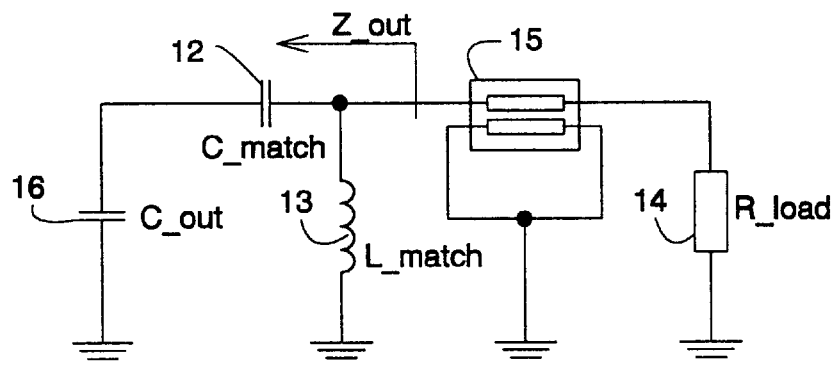
Figure 1C:
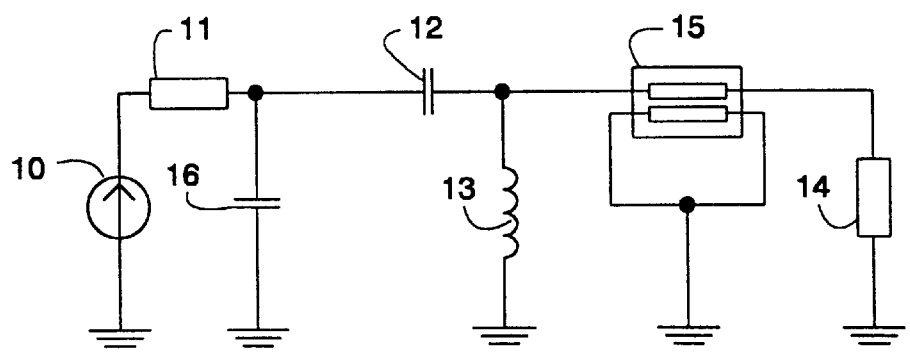

FIG. 1b shows a similar circuit in which a delay element, or phase shifter 15 consisting of transmission lines (a phase shifter as such may also consist of discrete components) has been added between the LC matching circuit 12, 13 and load 14. and in which no bias voltage is directed to the transistor so that in an equivalent: circuit such as the one according to FIG. 1b the transistor can be essentially depicted as just a capacitance 16 (the resistive part of the transistor output impedance is small and for simplified practical considerations negligible). At Z_out the impedance is then approximately reactive and in this case it complies, as a function of the angular frequency A, with the equation $$Z\_out(\omega) = 0 + j\frac{(C\_out + C\_match) \cdot L\_match \cdot \omega}{C\_out + C\_match - C\_out \cdot C\_match \cdot L\_match \cdot \omega^2} \quad (2)$$

where j stands for imaginary unit. The effect of the delay element (i.e. phase shifter.) 15 is such that the reactance shown in the equation, i.e. the coefficient of the imaginary unit j, turns inductive, in other words it gets a positive sign. The algebraic, representation pertains naturally to only this examplary embodiment: the practical consequence is that when the phase shift by the phase shifter is also appropriate, the output impedance of the unbiased amplifier seen from the load becomes high. FIG. 1c combines the amplifier representations of FIGS. 1a and 1b. If the impedance of the delay element 15 is chosen the same as the load 14 impedance, it does not affect the impedance matching of the output of the biased amplifier but only generates :a phase shift between the signal produced by the amplifier output and the signal appearing at the load.

Figure 2A:
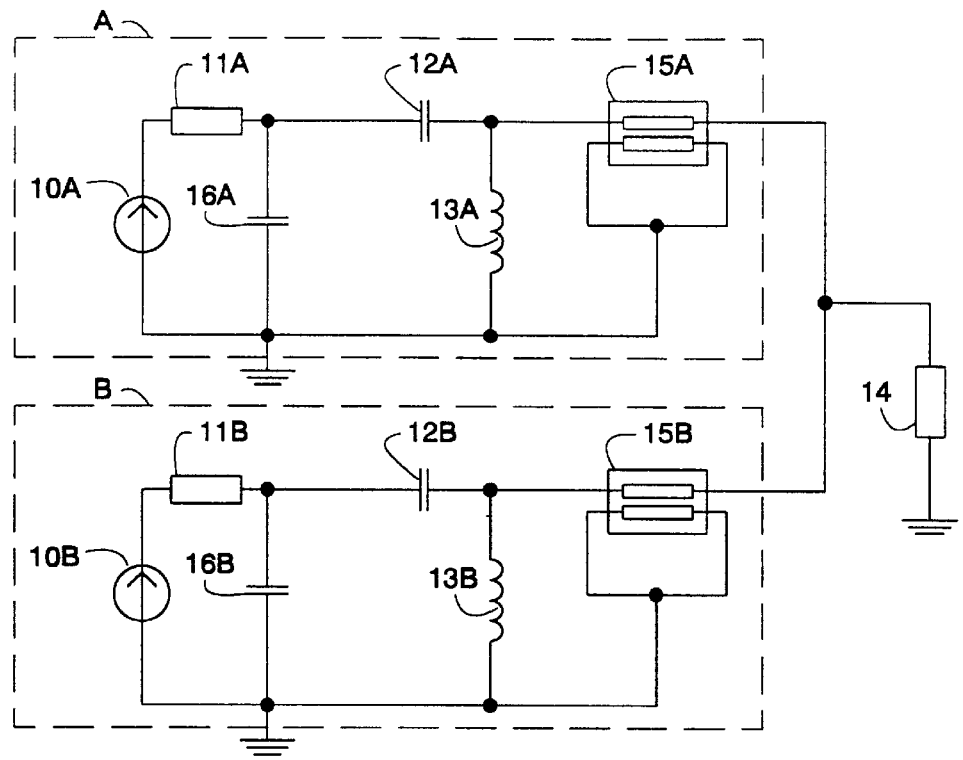
FIGS. 2a and 2b show a preferred embodiment of the invention.

FIG. 2a shows two amplifiers according to FIG. 1c which are connected in parallel and have a common load 14. Let the amplifiers be rated for different maximum power levels such that the maximum power of the upper amplifier A is greater than the maximum power of the lower amplifier B. If the amplifiers A and B are based on HBT transistors, it follows that a transistor's resistive output impedance 11B (while the transistor is biased into active state) in the lower amplifier is higher than the transistor's resistive output impedance 11A (while the transistor is biased into active state) in the upper amplifier. Similarly, the capacitance 16B represented by the transistor in the lower, lower-power amplifier (while the transistor is in unbiased state) is smaller than the capacitance 16A represented by the transistor in the uppe:r amplifier (while the transistor is in unbiased state). For the impedance of both of the amplifiers to be optimally matched to the load impedance for active operation the LC matching circuits must employ differing capacitances 12A and 12B and differing inductances 13A and 13B. Their values can be calculated from the pair of equations (1) presented above. If a circuit of alternative toplogy would be used, the calculation of component values for that topology would follow the procedures known as such in the art.

To be exact, the matching of output impedance in practical amplifier design usually proceeds by taking the load impedance seen by each amplifying transistor and setting it to an optimal value regarding the operating efficiency of the transistor. In some cases this procedure differs slightly from optimal (conjugate) matching referred to above. For the present invention this detail has minor importance, but it should be kept in mind when considering the active-state output impedances of amplifiers.

As such, optimisation of a transistor to a certain maximum power is known in thie prior art and is mainly carried out by correctly choosing the areas of the transistor's doped semiconductor parts. If the arrangement according to FIG. 2a is used in a terminal of the GSM system or a cellular radio system having equivalent transmission power specifications, the transistor of the upper amplifier A may be optimised e.g. to the maximum power of +34 dBm and the transistor of the lower amplifier B may be optimised e.g. to the maximum power of +24 dBm. Theoretically, the efficiency of both amplifiers at maximum power can be about 78.51% (commonly agreed reference value for tuned Class B amplifiers), using transistor constructions known at the moment of filing this patent application.

The impedance of the load 14 is typically 50 Ω. In the situation according to FIG. 2a, the active-state resistive output impedance 11A of the upper amplifier A may be as low as about 1 to 2 Ω so that, due to the difference of magnitude between it and the load 14, a small voltage swing in amplifier A results in a considerably larger voltage swing in the load 14. Big momentary potential differences caused by voltage swings in the various parts of the circuit may damage amplifier B in inactive state so that in practice, the solution according to figure A includes some risks when combined with HBT transistor constructions known at the moment of filing this patent application. This arrangement may become practical in the future, when components are developed that have better voltage handling capacities.

Figure 2B:
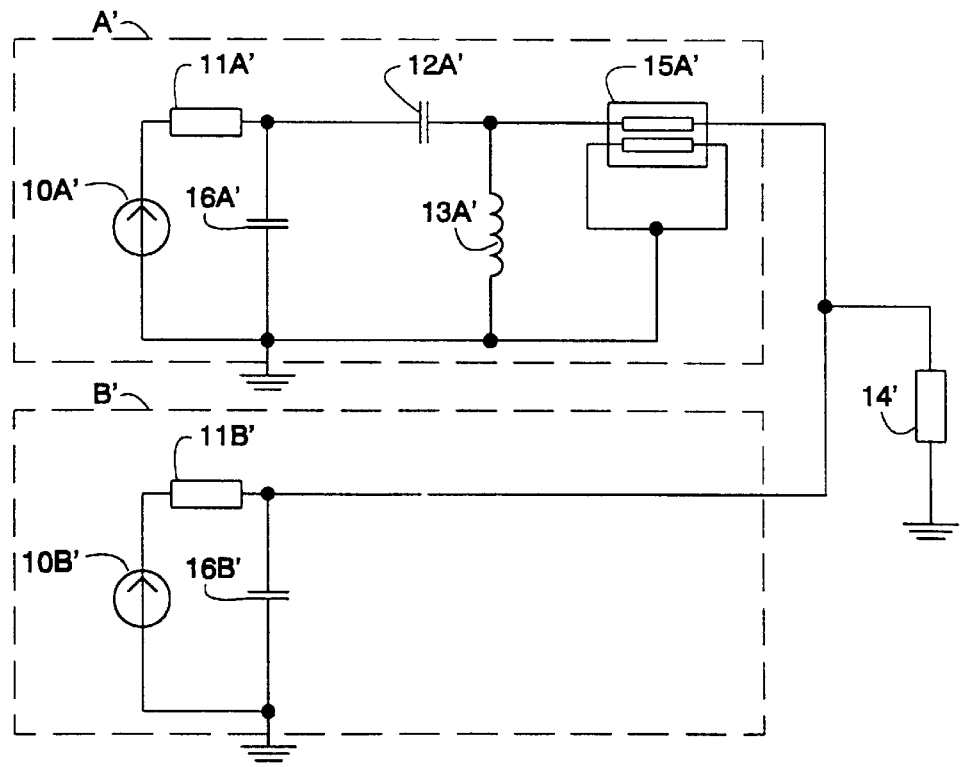

In FIG. 2b it is assumed that the impedance of the load 14' is not 50 Ω but smaller, say, 10 Ω; the load impedance is preferably the same as the resistive output impedance 11B' of the lower amplifier B' while the transistor is biased into active state. Other impedance levels may be selected as well. Then, essentially no LC matching circuit is needed between the lower amplifier B' and the load 14'. The upper amplifier A' is optimised to a higher maximum power so that, due to the characteristics of the HBT transistor, its resistive output impedance 11A' in biased state is smaller than the resistive output impedance 11B' of the lower amplifier B'. To match the resistive output impedance 11A' to the impedance of the load 14' an LC matching circuit formed by a capacitance 12A' and inductance 13A'is needed.

Furthermore, as the transistor of the lower amplifier B' is optimised to a low maximum power, the capacitance 16B' represented by it is, due to the transistor characteristics, so small in the unbiased state that the output impedance of amplifier B' seen from the load 14' is rather high (the reactance included in the impedance is inversely proportional to the capacitance). Then, when the upper amplifier A' is biased into active state and the lower amplifier B' is not, the upper amplifier is well matched to the impedance of the load 14', thanks to the LC matching circuit 12A' and 13A', and the lower amplifier B' has no significant effect on the signal between the upper amplifier A' and the load 14'. Correspondingly, when the lower amplifier B' is biased into active state and the upper amplifier A' is not, the resistive output impedance of the lower amplifier is, according to the assumption presented above, the same as the impedance of the load 14', and the impedance represented by the upper amplifier A', taking into account the effect of the phase shifter, is high enough so that it has no significant effect on the signal between the lower amplifier B' and the load 14'.

A somewhat more detailed consideration of the state of the lower amplifier B' may be justified to take into account some possible, although more rare, operational states of the circuit. The amplifier optimised to lower maximum power (amplifier B' above) will stay inactive only under certain circumstances. Especially when the other amplifier (amplifier A' above) operates on maximum power, it may happen in some cases that a voltage swing caused by it is enough to actually switch the low-power amplifier into active state, whereby the advantages gained by the invention could be lost. There are certain ways to prevent this from happening. For example, the operating voltage of the low-power amplifier could be raised to a suitably large value, say 6 V, which would then keep the amplifier inactive despite the mentioned voltage swing. Another solution would be to use a switch of suitably large impedance to tie the base electrode of the transistor of the low-power amplifier firmly to ground, thus eliminating any possible base current.

The arrangement according to FIG. 2b requires of the load an impedance other than the 50-Ω standard impedance. However, a load with a 50-Ω impedance can also be connected to the arrangement according to FIG. 2b if a suitable impedance matching network is connected between it and the arrangement according to FIG. 2b, said impedance matching network being e.g. of the LC type, as described above in connection with single amplifier output. A person skilled in the art can easily construct a suitable impedance matching network. So, the amplifiers in the amplifier circuit according to FIG. 2b are first optimised to an impedance other than a 50-ohm load impedance whereafter the impedance of the common output of the whole circuit is matched as desired, to 50 Ω, for example.

Figure 2C:
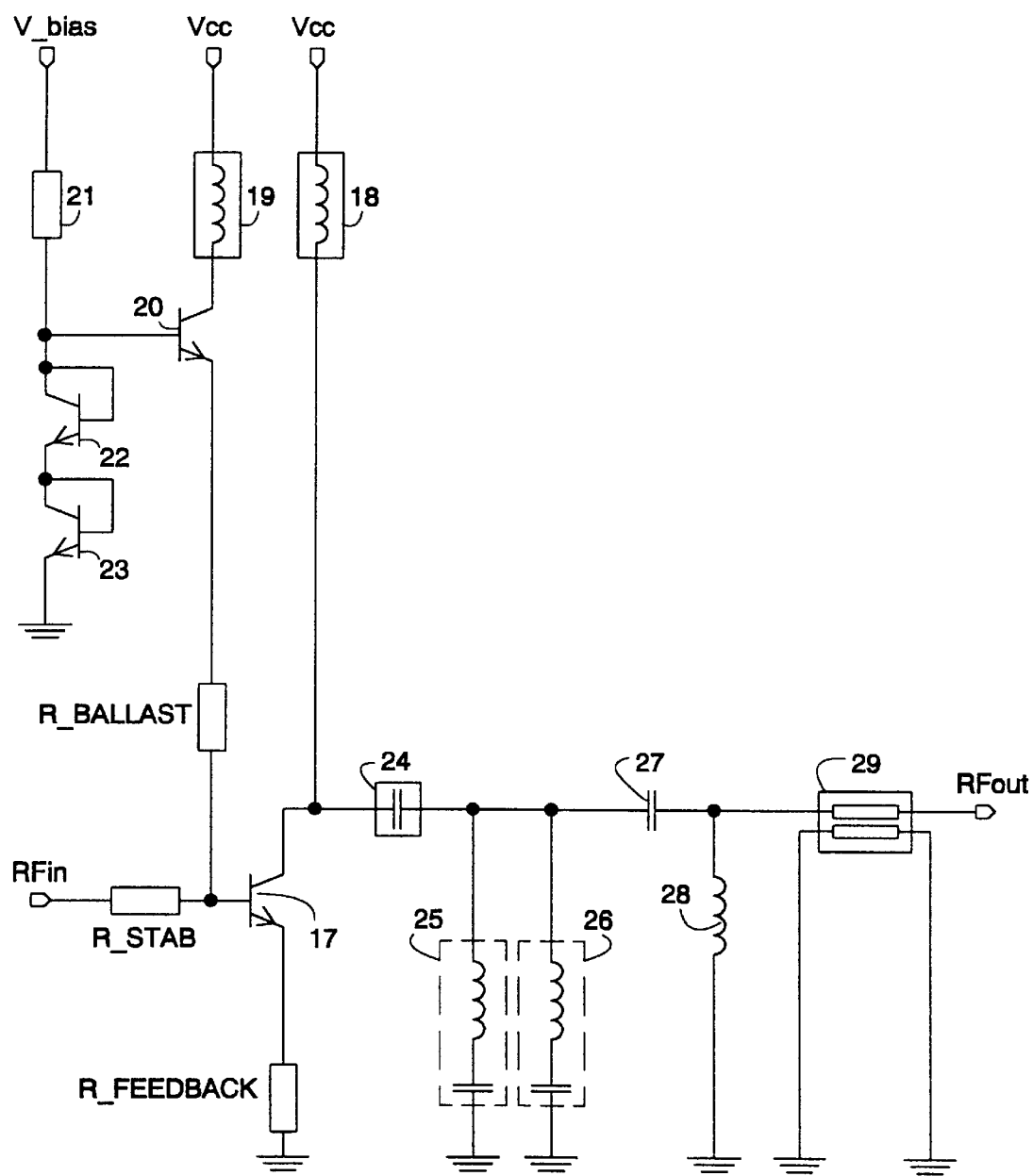
FIG. 2c shows a detail of the embodiment depicted in FIGS. 2a and 2b, FIGS. 3a to 3c illustrate the principle of the invention in the case of parallel amplifiers.

FIG. 2c shows an advantageous version of how a transistor used as an amplifying active component is located in the amplifiers schematically depicted in the previous, Figures and how bias and operating voltages are brought to the amplifiers. Transistor 17 is e.g. an HBT transistor and the amplifier's RF input RFin is3 connected to its base via a stabilising resistor R_STAB. The operating voltage of the amplifier is brought to the collector of the transistor 17 from a positive voltage Vcc via an inductance 18 lest the radio-frequency oscillation propagate from the amplifier to the operating voltage source. An inductance 19 is found between the positive voltage Vcc and the collector of a switching transistor 20; the inductance 19 may be included deliberately with a transmission line or a discrete component or it may illustrate here an inherent stray inductance. A resistor is sometimes used in place of or in addition to the inductance 19 to obtain better isolation. The emitter of the switching transistor 20 is connected to the base of the transistor 17 via a thermal ballast resistor R_BALLAST. From the base of the switching transistor 20 there is a connection via a resistor 21 to a bias voltage V_bias and via successive transistors 22 and 23 to earth potential. The bases of transistors 22 and 23 are connected to their collectors so that in practice the transistors 22 and 23 act as diodes, and transistors 20, 22 and 23 together form a known biasing circuit which produces suitable biasing to the base of transistor 17 when the bias voltage V_bias is turned on. The emitter of transistor 17 is connected to earth potential via a feedback resistor R_FEEDBACK.

The output of the amplifier is taken in the usual manner from the collector of transistor 17 via an isolating capacitance 24 which isolates d.c. voltages from the amplifier output. Inductance-capacitance series connections 25 and 26 between the signal path to the amplifier output and earth potential are called harmonic traps or armonic tuning circuits and they serve to eliminate in a known manner the undesired effects of harmonic multiples of the operating frequency. It should be noted that the harmonic traps appear as capacitances on the basic operational frequency so that they must be taken into account in the impedance matching considerations: they raise the output capacitance of the amplifying transistors. The need for eliminating the harmonics is determined separately in each application and there may be zero. one, two or more harmonic traps targeted at different harmonic frequencies. An LC matching circuit 27–28 (which could be replaced with some other matching circuit known as such, as explained previously in connection with FIG. 1a) and a delay element (i.e. phase shifter) 29 are similar to those described above, but the possible effect of the harmonics traps must be taken into account when choosing their ratings. It is obvious to one skilled in the art that the delay element, or phase shifter, can also comprise an implementation other than one based on transmission lines, such as a Pi- or T-network consisting of discrete components. The amplifier output is denoted by the reference designator RFout.

Figure 3A:
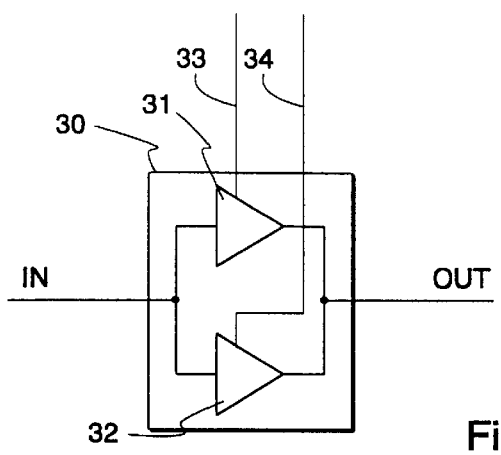

Next will be discussed the application of the arrangement according to the invention in a real radio apparatus. FIG. 3a schematically shows part of the transmitter branch in the radio-frequency part of a radio apparatus. An essential component in the transmitter branch is a power amplifier 30 which has an input IN and an output OUT. The function of the power amplifier 30 is to amplify a radio-frequency signal brought to the input IN such that it can be taken from the output OUT via the necessary filter and switching parts to the antenna of the radio apparatus. For simplicity, FIG. 3a shows no other parts of the transmitter branch than the power amplifier 30 to the structure of which the invention is directed in this case.

In the case of FIG. 3a, the power amplifier 30 comprises two parallel radio-frequency amplifiers 31 and 32 which preferably are transistor amplifiers as described above and which can be called amplifiers in short. The route of a signal inside the power amplifier branches such that the signal may be directed to both of the amplifiers 31 and 32. The outputs of the amplifiers are coupled together so that a signal amplified by both of the amplifiers can be directed to the output OUT of the power amplifier 30. A bias voltage or a bias current is brought to both amplifiers from outside the power amplifier 30. The bias voltage line of the upper amplifier 31 is denoted by reference designator 33 and the bias voltage line of the lower amplifier 32 is denoted by reference designator 34. Bias voltages can be connected to the amplifiers independently of each other via the lines 33 and 34. A bias voltage functions in a transistor amplifier in a known manner, i.e. its appropriately selected value sets the transistor acting as an amplifying component into active state. In the absence of a bias voltage, or when the bias voltage is near zero (a few. hundred millivolts at the most), the transistor is in inactive state and does not amplify signals. In addition to the bias voltages, both amplifiers need an operating voltage as usual. In accordance with the principles applied in drawing electric block diagrams, FIG. 3a does not show the operating voltage lines.

Figure 3B:
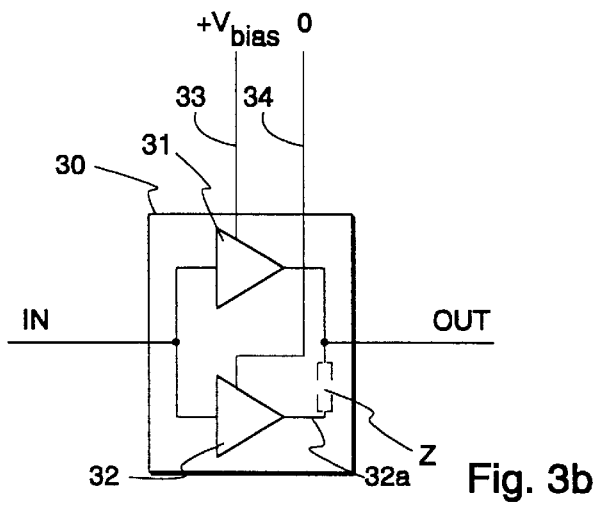

FIG. 3b schematically shows a situation in which a bias voltage is brought to a first amplifier 31 from outside the power amplifier 30 via line 33, but no bias voltage is brought to a second amplifier 32. The bias voltage is here positive, which is not a necessary requirement for the application of the invention. In accordance with the invention, the output 32a of the second amplifier 32 then presents high impedance Z. Correspondingly, in FIG. 3c, a bias voltage is brought to the second amplifier 32 from outside the power amplifier 30 via line 34, but no bias voltage is brought to the first amplifier 31 whereby the output 31a of the first amplifier 31 presents high impedance Z.

Figure 3C:
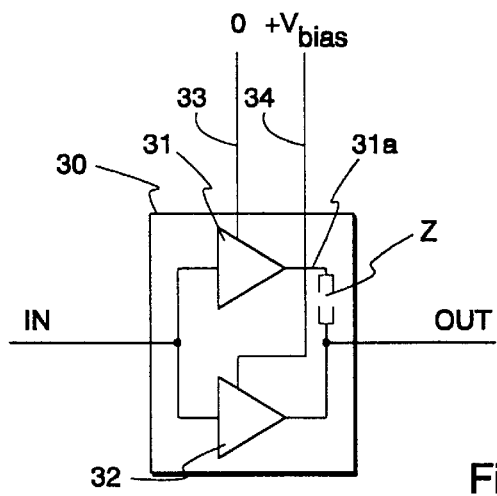

FIGS. 3a, 3b and 3c illustrate the principle of the invention in conjunction with two parallel and codirectional amplifiers. It is also possible to connect several codirectional amplifiers in parallel so that each of them has a bias voltage line of its own and only the amplifier that has a bias voltage brought to it is active. The outputs of the other amplifiers then present high impedance which has no significant effect on the signal produced by the output of the active amplifier.

In addition to or instead of using a bias voltage, an active component can be selected. by setting the operating voltages in a manner known as such so that it either enables or disables the active component in question. Switch-off also includes setting the operating voltage so low that it cannot bring an active component active. Peak: currents flowing through operating voltage lines are generally larger than in bias voltage lines, so a switch used for switching operating voltages has to be rated for a current larger than a switch used for switching bias voltages. From the point of view of the invention, the bias and operating voltages can collectively be called control signals.

Figure 4A:
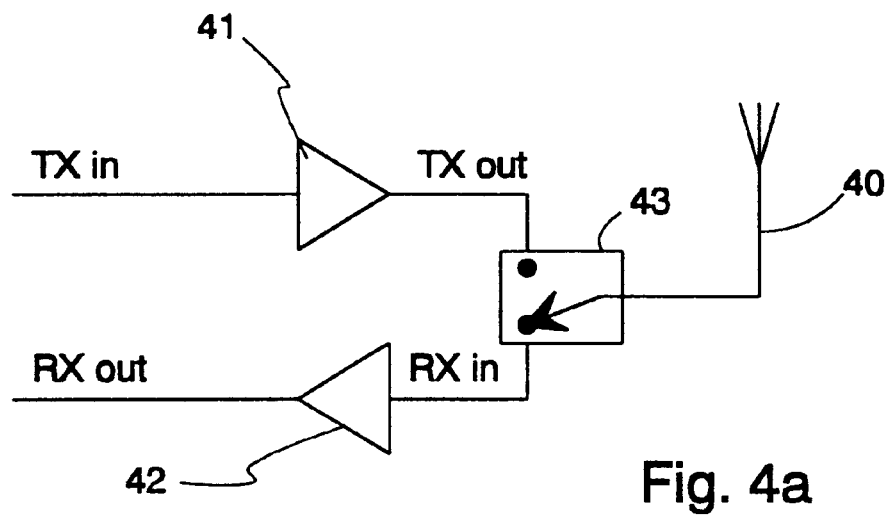
FIGS. 4a and 4b illustrate the application of the invention to a second circuit.
Figure 4B:
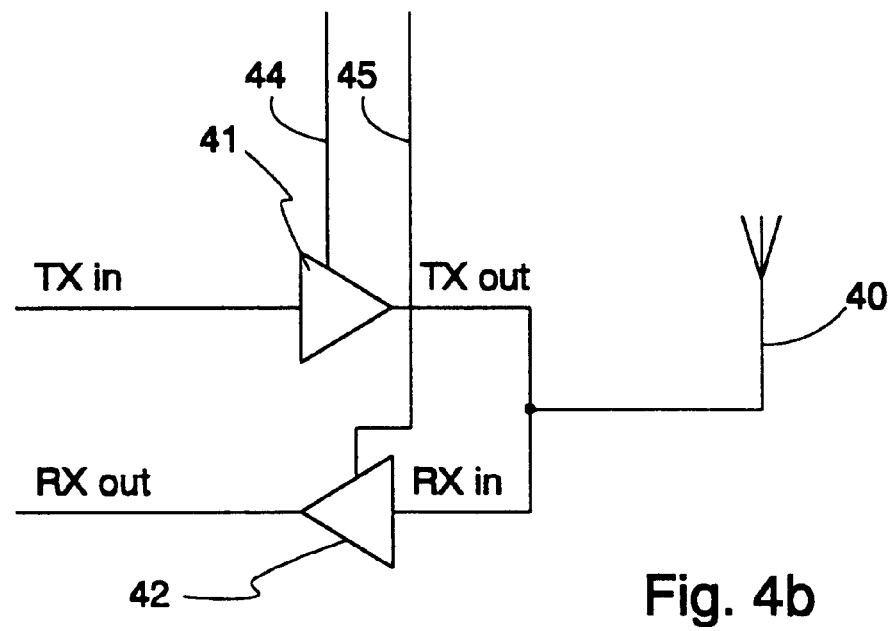

Above it was discussed the application of the invention only to the selection of parallel and codirectional amplifiers. The invention can also be applied in other ways to the selection of active components since by biasing or switching the operating voltage it is possible to affect not only the output impedance of the amplifier but also its input impedance. FIGS. 4a and 4b show part of the radio-frequency block of a radio apparatus. The FIGures show an antenna 40, transmitter power amplifier (PA) 41, and a receiver low-noise preamplifier (LNA) 42. The function of the PA 41 is to amplify a radio-frequency transmission signal brought to the input TXin and to direct it via the output TXout to the antenna 40. The function of the LNA is to amplify a radio-frequency reception signal received by the antenna 40 and brought to the input RXin, and to direct it via the output RXout to the receiver demodulator (not shown). FIG. 4a shows an arrangement according to the prior art where an antenna switch 43 couples to the antenna 40 for the duration of transmission the output TXout of the PA and for the duration of reception the input RXin of the LNA. FIG. 4b shows an arrangement according to the invention where the antenna switch is replaced by biasing the PA and LNA, represented by the bias lines 44 and 45. During transmission, the PA 41 is biased into active state so that its A-output TXout is matched to the impedance of the antenna 40 and the input RXin of the unbiased LNA 42 presents high impedance which has no significant effect on the signal between the PA 41 and antenna 40. During reception, the LNA 42 is biased into active state so that its input RXin is matched to the impedance of the antenna 40 and the output TXout of the unbiased PA 41 presents high impedance which has no significant effect on the signal between the antenna 40 and LNA 42.

The arrangement shown in FIG. 4b can be combined with the arrangement according to FIGS. 3a, 3b and 3c where the power amplifier of the transmitter comprises several parallel and codirectional radio-frequency amplifiers rated for different maximum power levels. For the duration of transmission, only one of them is biased into active state so that the outputs of the others present high impedance and do not affect the signal between the output of the active radio-frequency amplifier and the antenna. For the duration of reception, all radio-frequency amplifiers are left unbiased.

Figure 5:
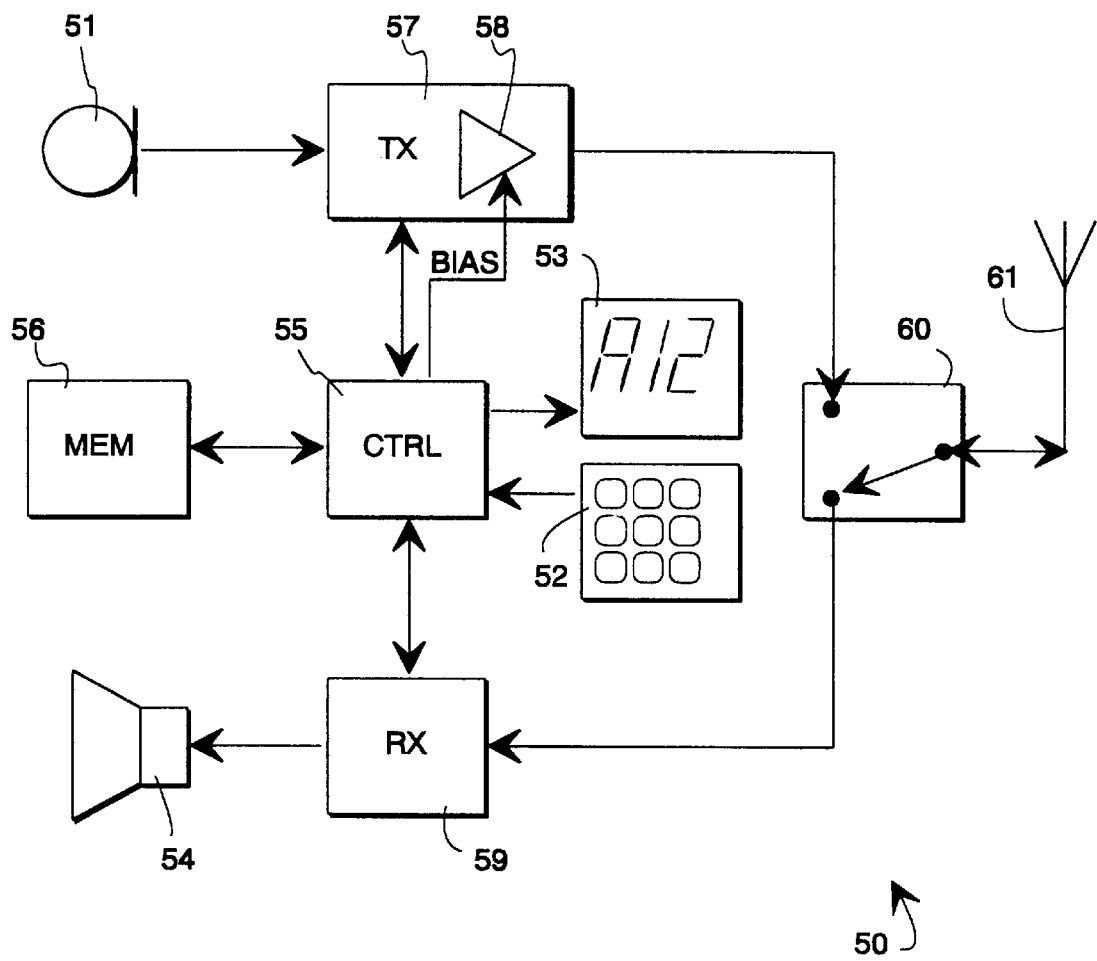
FIG. 5 shows a communications device according to the invention.

FIG. 5 schematically shows a cellular mobile phone 50 which is an example of a radio apparatus in which the arrangement according to the invention can be used. It comprises parts typical of prior-art mobile communications devices, such as a microphone 51, keypad 52, display 53, earphone 54, and a control block 55 that controls the operation of the terminal. The control block 55 can be typically realised using a microcontroller unit (MCU) and/or digital signal processor (DSP) and it has access to a memory 56. In addition, FIG. 5 shows a transmission block 57 which comprises speech encoding, channel encoding, scrambling and modulation as well as the transmission RF functions, of which it is shown a power amplifier 5;8 comprising two parallel radio-frequency amplifiers. FIG. 5 also shows a reception block 59 in accordance with the prior art, which comprises the reception RF functions, demodulation, descrambling, channel decoding and speech decoding. An antenna switch 60 is used to separate transmission and reception, and the transmission and reception of radio-frequency signals is performed through an antenna 61. The control block 55 is arranged so as to control the operation of the transmission 57 and reception block 59 according to a program stored in memory 56. In particular, of the parallel radio-frequency amplifiers in the power amplifier 58 it can bias into active state the one having the maximum power rating which best corresponds to the transmission power imposed on the terminal by a base station (not shown) of the cellular radio system. In FIG. 5, the biasing is schematically shown with only one bias line which represents the bias lines of all the radio-frequency amplifiers included in the power amplifier 58. The terminal receives and, decodes instructions related to power adjustment in the reception block 59 wherefrom they are directed to the control block 55.

Figure 6:
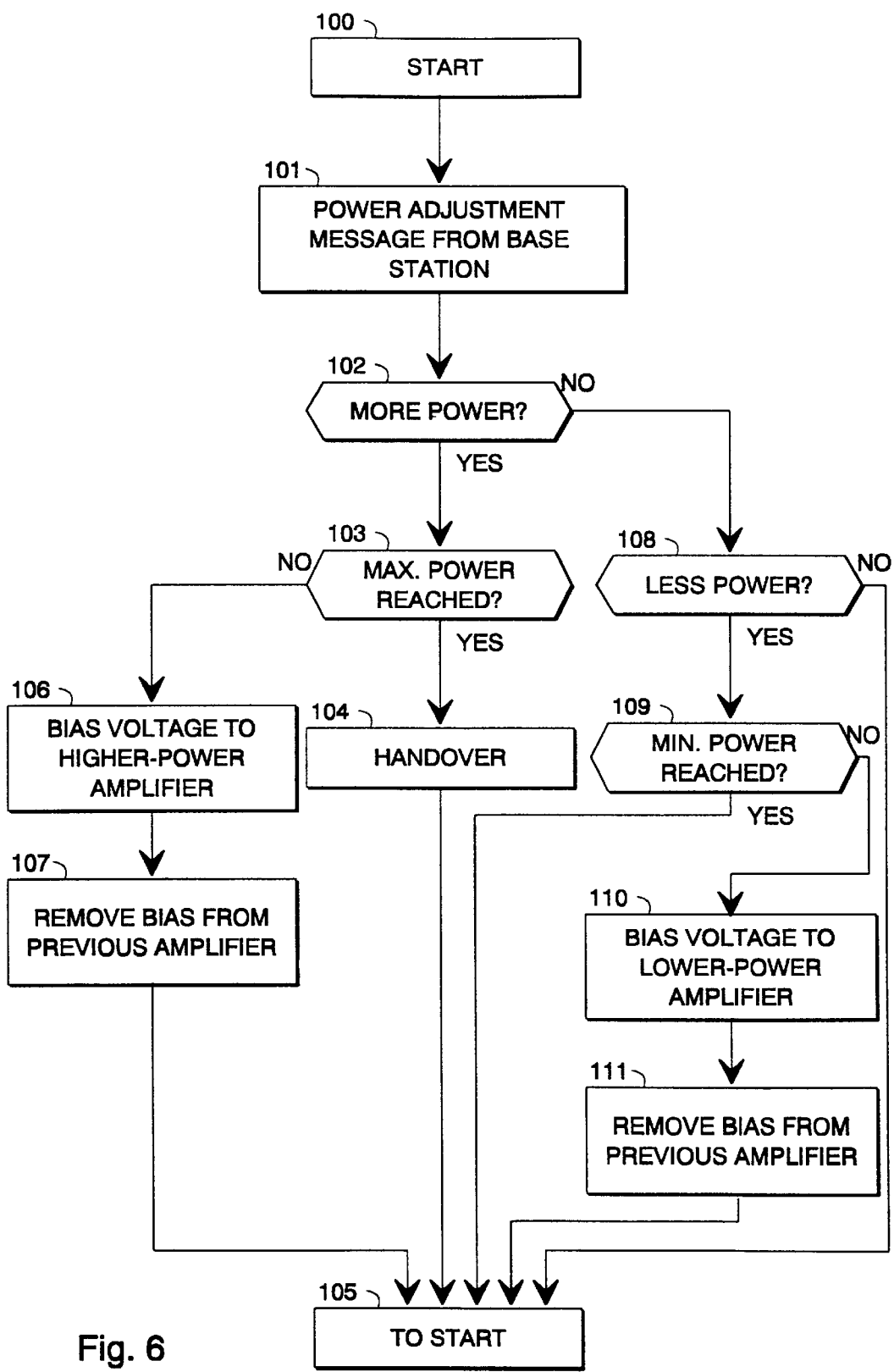
FIG. 6 shows a method according to the invention in the form of a state diagram.

FIG. 6 shows a preferred embodiment of the method according to the invention, applicable in a terminal of a cellular radio system. The operation starts from state 100. In state 101 the terminal receives from a base station a message in which the base station may issue a command to adjust the transmission power of the terminal. In state 102 the terminal checks whether the base station is instructing it to increase transmission power. If yes, the terminal checks in state 103 whether transmission power can be increased and if not, it commences handover preparations in state 104' and returns via state 105 to the start. If the terminal detects in state 103 that the maximum power is not yet in use, it connects in state 106 the bias voltage to the next higher-power amplifier and then removes in state 107 the bias voltage from thz transmission amplifier which was in use until now, and returns via state 105 to the start.

If the terminal in state 102 did not find in the message sent by a base station a command to increase transmission power, it checks in state 108 whether the base station instructs it to decrease transmission power. If not, the terminal returns via state 105 to the start. If the base station instructs the terminal to decrease its transmission power, the terminal checks in state 109 whether power can be decreased. If not, it continues operation with the lowest-power transmission amplifier and returns via state 105 to the start. If the lowest-power transmission amplifier is not yet in use, the terminal couples in state 110 the bias voltage to the next lower-power amplifier, removes in state 111 the bias voltage from the transmission amplifier which was in use until now, and returns via state 105 to the start.

The invention brings about savings in the manufacturing costs of a radio apparatus as well as in the need for space for its parts and in power consumption as there is no need on the signal path for a switch that would need space and cause losses and increase manufacturing costs. It is obvious to a person skilled in the art that the embodiments presented above are exemplary and do not limit the invention but the invention can be modified within the scope of the invention as defined by the claims set forth below. For example, in the case of parallel codirectional radio-frequency amplifiers, not all amplifiers need be rated for the same operating frequency, but ir so-called dual-band and multi-band radio apparatuses the arrangement according to the invention can be used to select the radio-frequency amplifier that is rated for the desired operating frequency. The idea of the invention could also be applied so that where there are active components of different power ratings, a switch known a, such from prior art solutions would be used in series with only the signal path oir signal paths going through those components with lowest power rating(s); the idea of exploiting the inherent output impedances explained above would then be used to eliminate the need for serially coupled switches from the higher-rated components; after all it is at the highest power where the largest losses are caused.

What is claimed is:

1. A communications device comprising:

a transmitter, in said transmitter, a first active component and a second active component, each active component being in a circuit branch, both active components comprising a signal input for coupling an oscillating input signal to the active component, a signal output for coupling an oscillating output signal from the active component and a control input for setting the active component into an active state by a certain first control signal value coupled to said control input and into an inactive state by a certain second control signal value coupled to said control input, first coupling means for coupling the signal input of the first active component to the signal input of the second active component, second coupling means for coupling the signal output of the first active component to the signal output of the second active component at a common coupling point, at least one of the active components being coupled to said coupling point via an impedance matching circuit, an impedance of said active component coupled via said matching circuit which is in an inactive state functioning as part of the impedance matching circuit, so that the branch having an active component set into an inactive state appears as a high impedance at said coupling point, and control means for selectively coupling a control signal to said first active component and said second active component to activate only one component, said control means having a first state and a second state, of which in said first state said control means is arranged to couple said first control signal value to the control input of said first active component and said second control signal value to the control input of said second active component, and in said second state said control means is arranged to couple said second control signal value to the control input of said first active component and said first control signal value to the control input of said second active component, wherein said first active component is a first power amplifier and said second active component is a second power amplifier, said control signal is based on a message about the power level, said message received from a base station.

2. The communications device of claim 1, wherein said transmitter comprises a power amplifier and said first active component and second active component are two identically oriented amplifiers connected in parallel in said power amplifier.

3. A communications device comprising:

a transmitter, in said transmitter, a first active component comprising a signal input for coupling an oscillating input signal to the first active component, a signal output for coupling an oscillating output signal from the first active component and a control input for setting the first active component into an active state by a certain first control signal value coupled to said control input and into an inactive low impedance, capacitively coupled state by a certain second control signal value coupled to said control input, a receiver, in said receiver, a second active component comprising a signal input for coupling an oscillating input signal to the second active component, a signal output for coupling an oscillating output signal from the second active component and a control input for setting the second active component into an active state by a certain first control signal value coupled to said control input and into an inactive state by a certain second control signal value coupled to said control input, first coupling means for coupling the signal output of the first active component to the signal input of the second active component at a common coupling point, at least one of the active components being coupled to said coupling point via an impedance matching circuit, an impedance of said active component coupled via said matching circuit which is in an inactive state functioning as part of the impedance matching circuit, so that a circuit branch having an active component set into an inactive state appears as a high impedance at said coupling point, and control means for selectively coupling a control signal to said first active component and said second active component, said control means having a first state and a second state, of which in said first state said control means is arranged to couple said first control signal value to the control input of said first active component and said second control signal value to the control input of said second active component, and in said second state said control means is arranged to couple said second control signal value to the control input of said first active component and said first control signal value to the control input of said second active component, wherein said first active component is a transmitter power amplifier and second active component is a receiver low-noise amplifier, said control signal is based on turns of transmission and reception in said communication device.

4. The communications device of claim 4, wherein said first active component is the transmitter power amplifier and second active component is the receiver preamplifier.

5. A method for controlling in a communications device the course of an oscillating signal in a first active component and a second active component, each active component being in a circuit branch, to activate only one of said first and second active component, which both comprise a signal input for coupling an oscillating input signal to the active component, a signal output for coupling an oscillating output signal from the active component and a control input for a control signal based on a received message from a base station of a cellular radio system, said control signal being arranged for setting the active component into an active state by a certain first control signal value coupled to said control input and into an inactive state by a certain second control signal value coupled to said control input, the first active component and the second active component being coupled to a common coupling point, at least one of the active components being coupled to said coupling point via an impedance matching circuit, an impedance of said active component coupled via said matching circuit which is in an inactive state functioning as part of the impedance matching circuit, so that a circuit branch having an active component set into an inactive state appears as a high impedance at said coupling point, said method comprising the steps of:

receiving from said base station a message on which said control signal is based, said control signal having a first control signal value, and a second control signal value, directing an oscillating signal to pass through the first active component by setting it into active state by a first control signal value coupled to its control input and at the same time essentially preventing the second active component from affecting the course of the signal by setting it into inactive state by a second control signal value coupled to its control input and directing an oscillating signal to pass through the second active component by setting it into active state by a first control signal value coupled to its control input and at the same time essentially preventing the first active component from affecting the course of the signal by setting it into inactive state by a second control signal value coupled to its control input.

6. The method of claim 5, wherein in a communications device in which said first active component and second active component are identically oriented amplifiers connected in parallel, the setting of the first active component into active state and the prevention of the effect of the second active component are carried out in response to a command to change the transmission power of said communications device.

7. The method of claim 5, wherein in a communications device in which said first active component is a transmitter power amplifier and said second active component is a receiver power amplifier, the setting of the first active component into active state and the prevention of the effect of the second active component are carried out in response to a command to begin a transmission of said communications device.

8. The communication device of claim 1, wherein the first active component and the second active component may not be activated simultaneously.

9. The method of claim 5, wherein the first active component and the second active component may not be activated simultaneously.

10. The communications device of claim 3, wherein the first active component and the second active component may not be activated simultaneously.

11. The communications device of claim 1, wherein maximum transmission power is obtained when only one of said active components is in an active state.

12. The method of claim 5, wherein more than one of said active components is a power amplifier, and maximum transmission power is obtained when only one of said active components is in an active state.

13. A system for arranging the control of communications devices comprising:
- a base station arranged to transmit a control signal as based on a power level message to communications devices, and
- a communications device comprising:
- a transmitter,
- in said transmitter, a first active component and a second active component, each active component being in a circuit branch, both active components comprising a signal input for coupling an oscillating input signal to the active component, a signal output for coupling an oscillating output signal from the active component and a control input for setting the active component into an active state by a certain first control signal value coupled to said control input and into an inactive state by a certain second control signal value coupled to said control input,
- first coupling means for coupling the signal input of the first active component to the signal input of the second active component,
- second coupling means for coupling the signal output of the first active component to the signal output of the second active component at a common coupling point, at least one of the active components being coupled to said coupling point via an impedance matching circuit, an impedance of said active component coupled via said matching circuit which is in an inactive state functioning as part of the impedance matching circuit, so that the branch having an active component set into an inactive state appears as a high impedance at said coupling point, and
- control means for selectively coupling a control signal to said first active component and said second active component to activate only one component, said control means having a first state and a second state, of which in said first state said control means is arranged to couple said first control signal value to the control input of said first active component and said second control signal value to the control input of said second active component, and in said second state said control means is arranged to couple said second control signal value to the control input of said first active component and said first control signal value to the control input of said second active component,
- wherein said first active component is a first power amplifier and said second active component is a second power amplifier, said control signal is based on a message about the power level, said message received from a base station.

14. A system for arranging the control of communications devices comprising:
- a base station arranged to transmit and receive messages from a communication device, and
- a communications device comprising:
- a transmitter,
- in said transmitter, a first active component comprising a signal input for coupling an oscillating input signal to the first active component, a signal output for coupling an oscillating output signal from the first active component and a control input for setting the first active component into an active state by a certain first control signal value coupled to said control input and into an inactive low impedance, capacitively coupled state by a certain second control signal value coupled to said control input,
- a receiver,
- in said receiver, a second active component comprising a signal input for coupling an oscillating input signal to
- the second active component, a signal output for coupling an oscillating output signal from the second active component and a control input for setting the second active component into an active state by a certain first control signal value coupled to said control input and into an inactive state by a certain second control signal value coupled to said control input,
- first coupling means for coupling the signal output of the first active component to the signal input of the second active component at a common coupling point, at least one of the active components being coupled to said coupling point via an impedance matching circuit, an impedance of said active component coupled via said matching circuit which is in an inactive state functioning as part of the impedance matching circuit, so that a circuit branch having an active component set into an inactive state appears as a high impedance at said coupling point, and
- control means for selectively coupling a control signal to said first active component and said second active component, said control means having a first state and a second state, of which in said first state said control means is arranged to couple said first control signal value to the control input of said first active component and said second control signal value to the control input of said second active component, and in said second state said control means is arranged to couple said second control signal value to the control input of said first active component and said first control signal value to the control input of said second active component,
- wherein said first active component is a transmitter power amplifier and second active component is a receiver low-noise amplifier, said control signal is based on turns of transmission and reception in said communication device.

* * * * *

UNITED STATES PATENT AND TRADEMARK OFFICE
CERTIFICATE OF CORRECTION

PATENT NO.    : 6,301,467 B1
DATED         : October 9, 2001
INVENTOR(S)   : Esko Jarvinen and Jukka Varis It is certified that error appears in the above-identified patent and that said Letters Patent is hereby corrected as shown below:

Column 11,
Line 65, "Claim 4" should read -- Claim 3 --.

Signed and Sealed this

Sixth Day of August, 2002

Attest:

JAMES E. ROGAN
Attesting Officer            Director of the United States Patent and Trademark Office